United States Patent
Kamseder et al.

(10) Patent No.: US 10,403,506 B2
(45) Date of Patent: Sep. 3, 2019

(54) SEPARATION OF WORKPIECE WITH THREE MATERIAL REMOVAL STAGES

(71) Applicant: Infineon Technologies AG, Neubiberg (DE)

(72) Inventors: Christoph Kamseder, Riekofen (DE); Franco Mariani, Pentling-Neudorf (DE); Andreas Bauer, Regensburg (DE); Thomas Fischer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/863,954

(22) Filed: Jan. 7, 2018

(65) Prior Publication Data

US 2019/0214299 A1 Jul. 11, 2019

(51) Int. Cl.
  *H01L 21/304* (2006.01)
  *H01L 21/78* (2006.01)
  *H01L 21/67* (2006.01)
  *H01L 21/66* (2006.01)

(52) U.S. Cl.
  CPC .... *H01L 21/3043* (2013.01); *H01L 21/67092* (2013.01); *H01L 21/78* (2013.01); *H01L 22/34* (2013.01)

(58) Field of Classification Search
  CPC ............... H01L 21/78; H01L 21/3043; H01L 21/67092
  See application file for complete search history.

(56) References Cited

U.S. PATENT DOCUMENTS

| | | | |
|---|---|---|---|
| 8,999,816 B1* | 4/2015 | Holden | H01L 21/78 438/113 |
| 2005/0101108 A1* | 5/2005 | Genda | H01L 21/67092 438/462 |
| 2006/0223234 A1* | 10/2006 | Terayama | H01L 21/6836 438/113 |
| 2007/0173035 A1 | 7/2007 | Izumi | |
| 2014/0110842 A1 | 4/2014 | Zenz et al. | |
| 2015/0125997 A1 | 5/2015 | Wang et al. | |
| 2016/0148842 A1 | 5/2016 | Ho et al. | |
| 2018/0166328 A1* | 6/2018 | Tang | H01L 23/48 |

FOREIGN PATENT DOCUMENTS

| | | |
|---|---|---|
| DE | 602 05 360 T2 | 6/2006 |
| JP | S60154639 A | 8/1985 |
| KR | 20010046386 A | 6/2001 |
| KR | 20110122002 A | 11/2011 |

\* cited by examiner

*Primary Examiner* — Selim U Ahmed
*Assistant Examiner* — Evan G Clinton (57) ABSTRACT

A method of manufacturing electronic dies by separating a wafer into electronic dies, wherein the method comprises forming a groove in the wafer with a first material removal tool having a first thickness, enlarging the groove by a second material removal tool having a second thickness larger than the first thickness, and subsequently increasing a depth of the groove by a third material removal tool having a third thickness smaller than the second thickness until the wafer is separated.

21 Claims, 3 Drawing Sheets

SEPARATION OF WORKPIECE WITH THREE MATERIAL REMOVAL STAGES

BACKGROUND OF THE INVENTION

Field of the Invention

The present invention relates to a method of manufacturing electronic dies by separating a wafer into electronic dies, a method for singulating dies, a method of separating a workpiece into separate sections, and an apparatus for separating a wafer into electronic dies.

Description of the Related Art

Packages may be denoted as encapsulated electronic dies with electrical connects extending out of the encapsulant and being mounted to an electronic periphery, for instance on a printed circuit board. Before packaging the electronic dies, a semiconductor wafer is singularized into a plurality of electronic dies. One or more of the electronic dies may then be encapsulated in an encapsulant of the package.

Singularization of a semiconductor wafer is accomplished in many cases by sawing the wafer mechanically into separate electronic dies. However, this may conventionally involve issues such as layer delamination, chipping or the generation of cracks on the front side, side wall or on the back side of the wafer. Corresponding separation artefacts may reduce reliability of the manufactured dies.

SUMMARY OF THE INVENTION

There may be a need for reliably separating a workpiece with a strong suppression of separation artefacts.

According to an exemplary embodiment, a method of manufacturing electronic dies by separating a wafer into the electronic dies is provided, wherein the method comprises forming a groove in the wafer with a first (for instance mechanical) material removal tool having a first thickness, enlarging the groove by a second (for instance mechanical) material removal tool having a second thickness larger than the first thickness, and subsequently increasing a depth of the groove by a third (for instance mechanical) material removal tool having a third thickness smaller than the second thickness until the wafer is separated (in particular at the groove).

According to another exemplary embodiment, an apparatus (which may for instance be one single machine or a combination of two or more different machines to process wafers) for separating a wafer into electronic dies is provided, the apparatus comprising a first (for instance mechanical) material removal tool having a first thickness and being configured for forming a groove in the wafer, a second (for instance mechanical) material removal tool having a second thickness larger than the first thickness and being configured for increasing a width of the groove, and a third (for instance mechanical) material removal tool having a third thickness smaller than the second thickness and being configured for further increasing the depth of the groove until the wafer is separated.

According to still another exemplary embodiment, a method for singulating a workpiece into sections is provided, wherein the method comprises forming a groove in the workpiece using a first saw blade having a first thickness, (optionally deepening and) widening the groove using a second saw blade having a second thickness, wherein the second thickness is larger than the first thickness, and further deepening the widened groove using a third saw blade having a third thickness, wherein the third thickness is smaller than the second thickness.

According to still another exemplary embodiment, a method of separating a workpiece into separate sections is provided, wherein the method comprises forming a groove in the workpiece up to a first depth and with a first width, subsequently widening the groove with a second width being larger than the first width (and optionally deepening the groove up to a second depth), and subsequently further deepening the groove until the workpiece is separated into the separate sections (in particular so that a resulting cut-out (or gap) has a portion with a third width smaller than the second width in a workpiece portion below the second depth).

According to an exemplary embodiment, a method for singulation of a workpiece (in particular a wafer) into sections (in particular dies or chips) is provided in which separation artefacts may be strongly suppressed both on a front side (where separation starts) and at a back side (where separation ends). In particular, the workpiece or wafer may be sawn using at least three saw procedures per scribe line (which may involve the use of at least two different saw blades having different thicknesses perpendicular to a sawing direction). More specifically, a first material removal procedure forming a narrow groove portion starting from a first main surface of the workpiece or wafer may be followed by a second material removal procedure forming a broader and preferably deeper groove, which may be followed, in turn, by a third material removal procedure completing separation of the workpiece or wafer by extending the groove up to an opposing second main surface of the workpiece or wafer by forming a more narrow groove portion there. By the third material removal procedure, the groove is hence converted into a cut-out extending through the workpiece or wafer and separating the workpiece or wafer. By such a procedure, a cutting pressure exerted on the workpiece can be reduced. At the same time, a larger surface for efficiently cooling during the separation process can be combined with back side optimized sawing. Hence, the mechanical stress and also the thermal stress acting on the wafer and the material removal tools may be significantly reduced. As a result, a proper quality on the front side and a substantially complete removal of optional test structures within sawing lines can be combined with a significant reduction or even elimination of singularization artefacts on back side and sidewalls of the dies. It may thus be possible to strongly suppress chipping on both front side and back side of the workpiece or wafer, avoid cracks, reduce burrs and suppress undesired nose formation on the back side. Also the quality of the sidewall may be improved.

DESCRIPTION OF FURTHER EXEMPLARY EMBODIMENTS

In the following, further exemplary embodiments of the apparatus and the methods will be explained.

In the context of the present application, the term "workpiece" may denote one single integrally formed body. One example for an integral workpiece is a semiconductor wafer before singularization in its electronic dies. Another example for an integral workpiece is a semiconductor wafer which is already partially singularized into its individual separate electronic dies, wherein however the electronic dies are integrally held together by a common carrier (in particular having an adhesive surface) on which the electronic dies are fixedly mounted. Such a carrier may for instance be a carrier tape or a carrier plate (for example made of glass or silicon) on which the individual electronic dies may be fixedly attached.

In the context of the present application, the term "wafer" may particularly denote a flat slice of semiconductor material, such as a crystalline silicon, used for the fabrication of electronic dies (in particular semiconductor dies). Such an electronic die may comprise one or more integrated circuit elements providing an electronic function and/or may be configured as a photovoltaic solar cell. The wafer may hence serve as substrate for microelectronic devices built in and over the wafer and may undergo microfabrication procedures before singularization.

In the context of the present application, the term "groove" may particularly denote an oblong recess or indentation in a surface of the wafer or workpiece. Such a groove may correspond to separation lines along which the wafer is separated into individual electronic dies. Originally, separation lines may be defined with structuring the wafer or dies.

In the context of the present application, the term "material removal tool" may particularly denote a body or device being capable of or configured for removing material of the workpiece or wafer to thereby form a respective groove for locally thinning and finally separating the workpiece or wafer into the individual sections or electronic dies. Material removal may be accomplished preferably mechanically, for instance by sawing using a saw blade of the respective material removal tool. Additionally or alternatively to such a mechanical separation, the separation may however also be supported or accomplished by a chemical or plasma treatment (such as etching) and/or a treatment with a beam (such as a laser treatment). Further or other corresponding methods may be used as well.

In the context of the present application, the term "thickness" of a material removal tool may particularly denote a physical dimension or size of the material removal tool defining a surface width of the wafer or workpiece which is removed by the impact of the material removal tool. The thickness of the material removal tool may be slightly smaller than or equal to a width of a groove or groove portion formed by this material removal tool. The thickness of the material removal tool may be its size in a direction perpendicular to a thickness of the wafer or workpiece to be separated. When the material removal tool is a disk-shaped saw blade, its thickness denotes the thickness of the exterior or exposed portion of the disk-shaped saw blade carrying out the actual sawing task. The thickness may be a size of the exterior or exposed portion along a direction corresponding to a rotation axis of the for instance disk-shaped saw blade. Possible examples for usable saw blades are hub blades and hubless blades, as shown in FIG. 7 to FIG. 10.

Although exemplary embodiments are described in terms of exactly three sawing procedures being carried out, it is alternatively also possible that more than three sawing procedures are carried out, i.e. at least one additional sewing procedure in addition to the three mentioned sawing procedures. When only three sawing procedures are carried out, a specifically quick and simple singularization is possible.

In an embodiment, the method comprises forming a further groove, extending along a direction being angled (in particular perpendicular) with regard to an extension of the said groove, in the wafer with the first material removal tool, enlarging (in particular a depth of) the further groove by the second material removal tool, and subsequently increasing a depth of the further groove by the third material removal tool until the wafer is separated at the further groove. For separating a wafer into electronic dies, parallel sets of grooves are formed in two perpendicular directions (see FIG. 4).

In particular, the method may comprise forming the further groove and/or enlarging the further groove and/or separating the wafer at the further groove after forming the groove and before separating the wafer at the groove. More particularly, the method may comprise increasing (in particular the depth of) the further groove by the second material removal tool before further increasing the depth of the groove by the third material removal tool until the wafer is separated at the groove. Thus, the method may comprise further deepening the widened groove in the workpiece using the third saw blade only after having formed the further groove intersecting the groove, extending perpendicular to the groove and not yet extending completely through the entire workpiece. For singularization of a disk-shaped workpiece or wafer into multiple sections or dies, separation along at least two in particular perpendicular directions is to be carried out. Highly advantageously, completion of separation along the first mentioned groove by the third cutting procedure with the third material removal tool may be postponed until the second cutting procedure has been carried out concerning the further groove. This maintains the integral character of the workpiece or wafer along the first direction (along which the groove extends) until the first two cutting procedures have been carried out along the second direction (along which the further groove extends). More generally, separation along the first direction is not yet completed according to the described embodiment when separation along the second direction starts. To finish the first (that is also an option of one embodiment) or the first two sawing/dicing procedures in both perpendicular directions is one option in a corresponding embodiment, but is not mandatory. It can be useful for process improvement. The workpiece can also be separated completely in one direction and then in the other perpendicular direction.

In an embodiment, the third thickness is larger than, smaller than or equal to the first thickness. For instance, the first material removal tool and the third material removal tool may be the same material removal tool (for instance a saw blade), so that the third thickness will be the same as the first thickness. However, in order to keep the quality at the back side very high, it is possible that the third thickness is selected even smaller than the first thickness. Also the heat impact on the back side will then be very small. Correspondingly, the first thickness may be even smaller than the third thickness if optimization of the quality at the front side is desired or can thereby be improved.

In an embodiment, the method comprises completing removal of at least one test structure (in particular at least one of a process control monitoring (PCM) test structure and/or a reliability control monitoring (RCM) test structure) by the second material removal tool. Such test structures may be formed in separation regions of a wafer between adjacent electronic dies in order to save semiconductor space for obtaining a high yield. However, when separating the wafer into individual electronic dies, test structure removal may be problematic and may result in artefacts such as burrs on a surface of the separated dies. When however completing removal of such test structures by the broad second material removal tool after having started test structure removal with the narrower first material removal tool, it has turned out to be reliably possible to completely remove such test structures without a risk of forming artefacts on a corresponding main surface (in particular front side) of the wafer or electronic dies separated therefrom. Additionally or alternatively to such test structures, also removal of pads, metal layers, etc. may be started in a corresponding way by the first material removal tool and may be completed by the second material removal tool.

In an embodiment, at least one of the first thickness and the third thickness is in a range between 20 µm and 60 µm, in particular in a range between 30 µm and 50 µm. Such a relatively small thickness value of the first and/or third material removal tool with corresponding dimensions of a respective groove portion (or finally cut-out) on one or both opposing main surfaces of the workpiece or wafer allows preventing artefacts such as burrs and chipping on any of the two main surfaces.

In an embodiment, the second thickness is in a range between 60 µm and 150 µm, in particular in a range between 70 µm and 120 µm. This relatively large thickness of the second material removal tool with corresponding dimensions of a respective groove section ensures a distribution of the mechanical load and heat impact during singularization to a relatively large area and volume. At the same time, this relatively large thickness also ensures that optional test structures and/or other metallisation layer portions in separation regions between electronic dies of the wafer can be completely removed by the second material removal procedure without excessive burr.

Preferably, a ratio between the second thickness and the first thickness and/or a ratio between the second thickness and the third thickness is in a range between 1.1 and 4, in particular 1.5 and 3, respectively. This allows keeping separation artefacts very small.

In an embodiment, a depth of the groove up to which the first material removal tool extends is in the range between 10% and 40%, in particular in a range between 20% and 30%, of an entire thickness of the wafer. For instance, the first material removal tool may extend into the workpiece or wafer up to about one quarter of the entire thickness of the workpiece or wafer. This may ensure that the front side portion of the wafer or workpiece is properly and quickly prepared for subsequent treatment with the second material removal tool without the first groove portion being extensively thick or thin.

In an embodiment, a depth of the groove up to which the second material removal tool extends is in the range between 60% and 90%, in particular in a range between 70% and 80%, of an entire thickness of the wafer. For example, the second material removal tool may extend up to about three quarters of the entire thickness of the workpiece or wafer. In other words, the second material removal tool may further extend the depth of the groove by about half of the entire thickness of the workpiece or wafer.

In an embodiment, a thickness of the wafer may be in a range between 600 µm and 1000 µm. The wafer may be a non-thinned wafer. For example, such a semiconductor wafer may have a thickness of 725 µm. Thus, relatively thick but nevertheless mechanically sensitive wafers need to be separated. By the three-step cutting procedure according to an exemplary embodiment, even such mechanically sensitive workpieces can be properly singularized. It should however be mentioned that in other exemplary embodiments, the wafer may even be thinner, for instance thinner than 500 µm, for example 400 µm.

In an embodiment, a carrier is attached (for instance by an adhesive layer) to a main surface of the wafer before separation and may be kept on the wafer during separation. After singularization, the individual sections or electronic dies may be released individually from the carrier and may be placed for instance in cavities of a tape of a tape-and-reel device. Alternatively, a pick-and-place apparatus may pick the singularized electronic dies individually from the carrier. Thus, the carrier can be denoted as a temporary carrier which does not form part of the readily manufactured sections or dies. Such a carrier may be, for instance, a plate or preferably a tape. In the context of the present application, the term "tape" may particularly denote a thin film, foil, sheet or layer of material having at least some elasticity. For example, such a tape may be a dicing tape used for dicing a wafer mounted on the tape with the tape being, in turn, mounted on a frame. For example, such a tape may be made of a plastic, which may or may not be coated with an electrically conductive coating for instance comprising carbon, and/or which may also comprise another material such as a fluorescence material.

In an embodiment, during further increasing the depth of the groove by the third material removal tool until a cut-out is formed, the third material removal tool extends into the carrier (in particular tape). Such a slight penetration of the third material removal tool into the carrier at the end of the corresponding separation procedure may ensure a reliable and complete separation of the workpiece or wafer into sections or dies. The depth of the cut into the tape is responsible for building the above mentioned undesired nose which may be formed by usage of very thick blades.

In an embodiment, the wafer is a semiconductor wafer. For instance, the wafer may be a silicon wafer. At least one integrated circuit element (such as a transistor, a diode, a resistor, a capacitance, an inductor, etc.) may be monolithically integrated in each electronic die of the wafer. The wafer may be covered with one or more metallization layers on top which allow an exterior electric access to the integrated circuit elements. Also such metallization layers may be at least partially removed during the singularization procedure.

In an embodiment, at least one of the first material removal tool, the second material removal tool and the third material removal tool is or comprises a saw blade. Such a saw blade may for example be a disk-shaped body with a sharp annulus or perimeter (also denoted as exposure) which can be rotated and can be simultaneously inserted into the workpiece or wafer to be separated. The sharp perimeter may form a cutting edge which can enter into the workpiece of wafer to thereby form a corresponding portion of the groove or cut-out.

In an embodiment, the wafer is non-encapsulated at the time of separating. In other words, the wafer may be free of an encapsulant (such as a mold compound) when being singularized. The above-described issues (in particular what concerns front side chipping and back side chipping, risk of cracking and delamination, as well as burr formation) when singularising a wafer are specifically pronounced when the wafer is not-molded when being separated. Thus, singularising a non-encapsulated wafer involves specific challenges both on its front side and on its back side and therefore benefits in a particularly pronounced manner from the advantages of the described three-step separation procedure.

In an embodiment, the first material removal tool is also used as the third material removal tool, i.e. these two material removal tools may be the same tool. In other words, the first material removal tool and the third material removal tool may be one and the same tool. This makes it possible that only two material removal tools (i.e. the first material removal tool being identical to the third material removal tool, and additionally the different second material removal tool) need to be provided at the apparatus. Consequently, the manufacturing apparatus may be highly compact and the method of separating can be carried out very quickly.

In another embodiment, the first material removal tool and the third material removal tool are different tools. This has the advantage that saw blades used as first material removal tool and as third material removal tool can be adapted and adjusted individually and differently to the respective task of the first material removal tool and the third material removal tool, respectively. For instance, the first material removal tool may be adjusted specifically to promote opening of pad structures or the like on the front side of the wafer. The third material removal tool may for example be adjusted specifically to prevent back side chipping. Corresponding design parameters which may be adapted for the respective purpose are for instance size and amount of diamond particles in the exposure of the respective saw blade. Also the material of a matrix of the exposure (for instance nickel) may be adjusted correspondingly. For instance, the saw blade of the first material removal tool may have smaller diamonds and a higher mesh size than the saw blade of the third material removal tool which may have larger diamonds and a lower mesh size. Other design parameters in this respect are the freely-selectable blade parameters such as thickness and length of the saw blade (in particular of its exposure, wherein dicing/sawing blades are applicable for a variation of these or other parameters), as well as machine parameters such as the rotation speed, the feed speed, etc.

In an embodiment, the apparatus comprises a control unit (which may be a processor, part of a processor, or multiple processors) configured for controlling the first material removal tool, the second material removal tool and the third material removal tool to carry out any of the embodiments of the methods as described herein. In particular, such a control unit may be provided with computer executable code defining the procedures to be carried out by the apparatus in form of a corresponding algorithm in order to separate the workpiece or wafer. Under the control of the control unit, the various material removal tools (for instance saw blades) may be selected and moved relative to the workpiece or wafer for carrying out a defined cutting procedure (in particular with a defined rotation speed) up to a defined depth (which may be defined by relatively moving the corresponding saw blade and the wafer along a predefined trajectory) with a defined thickness (which may be defined by correspondingly selecting a respective saw blade) at a certain position.

In an embodiment, singularization of the wafer may be carried out before packaging the electronic dies on the wafer. In other words, the electronic dies of the wafer to be singularized may still be free of an encapsulant material (such as a mold compound) at the time of separating the wafer into the individual electronic dies. However, alternatively, the wafer may be covered by an encapsulant or by casing structures capping the electronic dies or parts thereof at the time of singularising.

The respective portion of the individual saw blades, which portion protrudes into the wafer or workpiece may have a substantially rectangular cross-section so as to ensure that the respective saw blade or material removal tool forms a substantially rectangular groove section in the wafer or workpiece. Alternatively, a tip of the saw blade protruding into the wafer may also have a tapering shape, for instance a conically tapering shape. As a result of wear, the flange face of the saw blade may also be rounded.

In an embodiment, the electronic dies are power semiconductor dies. Such a power semiconductor die may have integrated therein one or multiple integrated circuit elements such as transistors (for instance field effect transistors like metal oxide semiconductor field effect transistors and/or bipolar transistors such as insulated gate bipolar transistors) and/or diodes. Exemplary applications which can be provided by such integrated circuit elements are switching purposes. For example, such another integrated circuit element of a power semiconductor device may be integrated in a half-bridge or a full bridge. Exemplary applications are automotive applications.

The one or more semiconductor dies may comprise at least one of the group consisting of a diode, and a transistor, more particularly an insulated gate bipolar transistor. For instance, the one or more electronic dies may be used as semiconductor dies for power applications for instance in the automotive field. In an embodiment, at least one semiconductor die may comprise a logic IC or a semiconductor die for RF power applications. In one embodiment, the semiconductor die(s) may be used as one or more sensors or actuators in microelectromechanical systems (MEMS), for example as pressure sensors or acceleration sensors.

As workpiece or wafer for the semiconductor dies, a semiconductor workpiece, preferably a silicon workpiece, may be used. Alternatively, a silicon oxide or another insulator workpiece may be provided. It is also possible to implement a germanium workpiece or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION OF EXEMPLARY EMBODIMENTS

The illustration in the drawing is schematically and not to scale.

Before exemplary embodiments will be described in more detail referring to the figures, some general considerations will be summarized based on which exemplary embodiments have been developed.

Wafers may be singularized by a mechanical treatment. In a conventional so-called step cut procedure, various layers on the wafer front side can be sawn using a broad saw blade. Subsequently, the wafer may then be singularized by a thinner saw blade. In a scenario in which a wafer with a process control monitoring (PCM) test structure or a reliability control monitoring (RCM) test structure and/or with large metallic of oxide surfaces needs to be singularized, the use of the broad saw blade may result in the formation of pronounced burrs. Moreover, the mentioned broad impact area of the broad saw blade may apply a significant lateral amount of load (heat and cutting pressure) onto a cutting edge. This, in turn, increases the risk of layer delamination, chipping and the formation of cracks on the front side of the wafer.

In another procedure, a wafer may be separated starting with a narrow saw blade inserted into a surface portion of the wafer on the front side only. Subsequently, singularization of the wafer may be completed by a broader saw blade. However, the described approach may still result in back side chipping and sidewall chipping in a way which is difficult to control.

In order to overcome the above described shortcomings, a singularization procedure according to an exemplary embodiment involves partially sawing a workpiece (such as a wafer) using a narrow saw blade. Subsequently, test structures (such as PCM and/or RCM test structures) may be completely removed using a broader saw blade. During this procedure, the depth of the sawn groove in the workpiece may be increased. The singularization procedure may then be completed by completely sawing through the entire workpiece for separation by an again narrower saw blade.

The described procedure has the advantage that, as a result of the initial sawing with a narrower saw blade, the tendency of burr formation can be reduced. Moreover, corresponding sections or dies of the workpiece or wafer are significantly less prone to delamination by inert layer stress acting on the workpiece or wafer during separation, in particular compared to the above described step cut procedure. Thermal and mechanical load exerted on the material of the workpiece or wafer (by the resulting heat impact and the exerted cutting pressure) in particular during the second procedure may be significantly reduced, in particular compared to the above described method with a small blade followed by a broad blade. In the mentioned second procedure using a broader saw blade, optionally still present rests of test structures (which may be arranged in separation regions in which singularization is to be carried out in order to efficiently use valuable semiconductor area) may be completely removed in the cutting regions. During the mentioned procedure also a remarkable part of the material of the workpiece or wafer may be removed (in particular by abrasion), although the workpiece or wafer is not yet singularized in this second procedure. Consequently, reduced front side chipping may be achieved, since the wafer is not yet separated in the second sawing stage. In the above-mentioned third procedure, singularization of the workpiece or wafer is completed by the use of a narrower saw blade, in particular for sidewall and back side treatment optimization. As a result, back side chipping may be significantly reduced as well.

By the described process, in particular separation of workpieces and wafers with a pronounced thickness, with a high density of test structures (such as PCM/RCM test structures), and/or with a high metal loading in the scribe line may be singularized efficiently and in a reproducible way, wherein also the amount of removed material can be kept small. These advantages can be combined with the further advantages of a lower mechanical load acting on the broader saw blade, and a strong suppression or even elimination of burrs on the front side and back side of the wafer or workpiece. Furthermore, contamination with dirt and pollutant (such as silicon particles) may be reduced (for instance in the scribe line) as a result of a high water reservoir at this stage and the opportunity of an improved later cooling during the cutting process.

The configuration of a respective saw blade for each of the three procedures can be selected individually, in particular in terms of binding, grain size, concentration and dimension.

Exemplary embodiments also have the advantage that there is a high degree of flexibility concerning the selection of the sequence of the individual procedures in the different spatial directions of the workpiece or wafer. Such a freedom of designing the procedure in detail provides a further potential for optimization of the singularization procedure.

Figure 1:
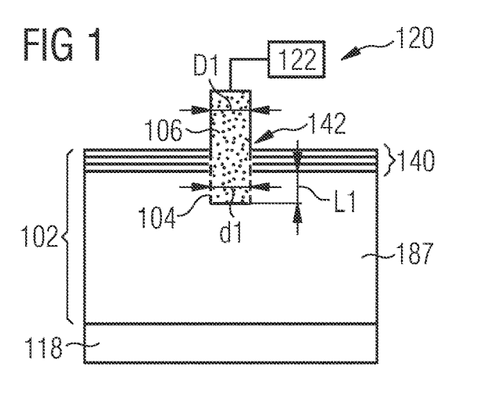
FIG. 1 to FIG. 3 show cross-sectional views of structures obtained during carrying out a method of manufacturing electronic dies by separating a wafer into the electronic dies according to an exemplary embodiment.
Figure 2:
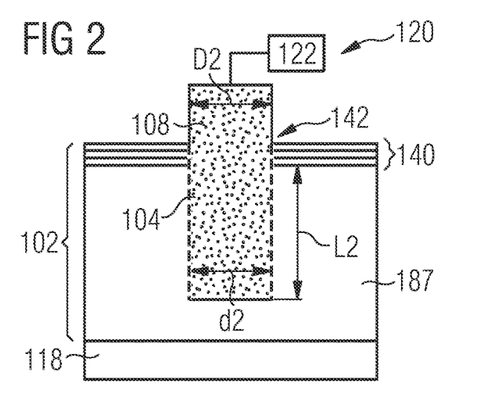
Figure 3:
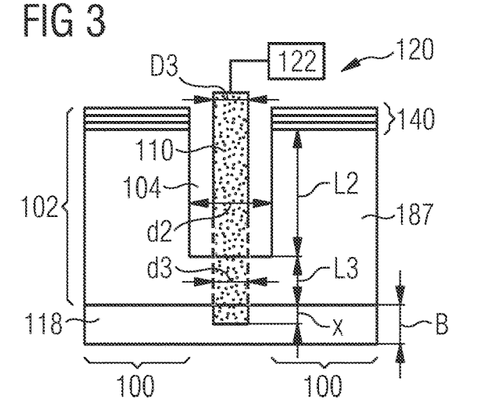

FIG. 1, FIG. 2 and FIG. 3 show cross-sectional views of structures obtained during carrying out a method of manufacturing electronic dies 100 by separating a wafer 102 into the electronic dies 100 according to an exemplary embodiment. During carrying out this method, the wafer 102 is separated into the electronic dies 100 by sawing along parallel scribe lines in each of two perpendicular sawing directions. One of these sawing procedures will be described referring to FIG. 1 to FIG. 3.

FIG. 1 shows a cross-sectional view of a part of the wafer 102 (which is here embodied as a silicon wafer). In the shown embodiment, a layer arrangement 140 is formed on and in an upper main surface of a semiconductor body 187 of the wafer 102. For example, the layer arrangement 140 can comprise one or more metallization layers. In such a configuration, the layer arrangement 140 may serve as electric contact structure with pads for contacting one or more monolithically integrated circuit elements (which may be arranged in a lower portion of the layer arrangement 140), such as integrated transistors, with an electronic periphery of the electronic dies 100 to be manufactured. It is also possible that the layer arrangement 140 comprises test structures (such as PCM and/or RCM test structures). Such test structures may be constituted as use structures of the electronic dies 100 to be manufactured and can be tested during a functional check prior to singularization of the wafer 102. Since such test structures are no longer needed after singularization, they can be formed in a saw line 142, i.e. in a region to be sawn between different electronic dies 100 to be formed (compare FIG. 3), to efficiently use valuable semiconductor area of the wafer 102. Descriptively speaking, the layer arrangement 140 may comprise the intelligence of the electronic dies 100 to be separated.

As can be taken from FIG. 1 as well, the wafer 102 may be attached to an adhesive carrier 118 prior to singularization. For example, the carrier 118 may be a flexible and adhesive dicing tape onto which the wafer 102 is attached prior to singularization so that the singularized electronic dies 100 remain adhered individually on the carrier 118. This allows picking individual separated electronic dies 100 from carrier 118, for instance in terms of a pick-and-place procedure or for preparing a tape-and-reel procedure which can be carried out by an assembler.

FIG. 1 also illustrates part of an apparatus 120 for separating the wafer 102 into the electronic dies 100. The apparatus 120 comprises a first material removal tool 106, which is here embodied as a first saw blade rotating around a horizontal axis according to FIG. 1. For instance, a revolution speed of the first material removal tool 106 can be 55,000 rounds per minute (or more generally in a range between 30,000 rounds per minute and 60,000 rounds per minute). The first material removal tool 106 and the wafer 102 can be moved relative to one another so that the first material removal tool 106 cuts through the layer arrangement 140 and protrudes into the wafer 102. The first material removal tool 106 has a first thickness D1 of for instance 40 μm in a lateral direction perpendicular to the thickness of the wafer 102. When being rotated and being moved relative to the wafer 102, the first material removal tool 106 removes material of the layer arrangement 140 and subsequently of an upper part of the wafer 102 for forming a groove 104 in the wafer 102. Apart from the relative vertical movement between the first material removal tool 106 and the wafer 102, the first material removal tool 106 and the wafer 102 may also be moved relative to one another perpendicular to a paper plane of FIG. 1 so as to cut an oblong longitudinal groove 104 along a direction or an extension being denoted with reference numeral 114 in FIG. 4. The first material removal tool 106 may move along direction 194 and along direction 195, whereas the wafer 102 may move along direction 196 and may turn corresponding to arrow 197. In view of the substantially rectangular cross-section of the first material removal tool 106 in particular at a sawing position in FIG. 1, the thickness D1 of the first material removal tool 106 results in the formation of groove 104 having a width d1 (which may be slightly larger than the thickness D1, for instance 2 μm to 5 μm larger) and having a depth L1.

The described operation of the first material removal tool 106 and the wafer 102 (which may be arranged on a chuck or other support body) is controlled by a control unit 122 of the apparatus 120. The control unit 122 (for instance a processor which carries out computer executable code in accordance with a singularization method or algorithm) is configured for controlling the first material removal tool 106 to cut the described groove 104 with the described depth L1 and the described width d1. The depth L1 may for instance correspond to about one quarter of the entire thickness of the wafer 102. For instance, the thickness of the wafer 102 may be in a range between 500 μm and 1000 μm, and the depth L1 may be in a range between 100 μm and 300 μm.

During the cutting or sawing procedure, the first material removal tool 106 and/or the wafer 102 may be cooled, for instance by a flow of water or another coolant (not shown). Such a cooling may be applied also to the below described second material removal tool 108 and/or third material removal tool 110.

Figure 5:
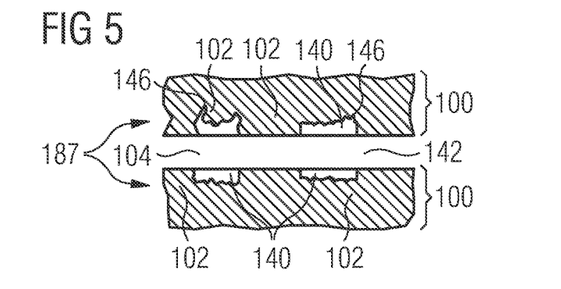
FIG. 5 illustrates the undesired phenomenon of formation of burrs at a surface of a wafer which may occur during singularizing a wafer into separate electronic dies and which may be efficiently suppressed by exemplary embodiments.

By starting formation of the groove 104 with a relatively (i.e. compared to the second material removal tool 108) narrow first material removal tool 106 having a thickness D1 of only 40 μm, highly undesired burrs 146 (compare FIG. 5) can be largely avoided at left and right of the dicing or sawing line 142. Pad structures of layer arrangement 140 on the wafer 102 may be opened by the thin blade of the first material removal tool 106, and formation of burrs 146 as well as chipping may be strongly suppressed. In comparison to a conventional approach of dicing only with a broad blade, the broad blade in form of the second material removal tool 108 used in combination with the more narrow first and third material removal tools 106, 110 is capable of removing residual chippings and burrs 146.

FIG. 2 shows a second procedure carried out by apparatus 120 during singulating wafer 102 with the method described referring to FIG. 1 to FIG. 3.

For this second procedure, the apparatus 120 comprises a second material removal tool 108, which is embodied as a second saw blade and which is controlled as well by control unit 122. The second material removal tool 108 has a second thickness D2 which is larger than the first thickness D1 and which may for instance be 80 μm. The second material removal tool 108 is also configured for rotating around a rotation axis corresponding to a horizontal direction according to FIG. 2. For instance, a revolution speed of the second material removal tool 108 can be 55,000 rounds per minute (or more generally in a range between 30,000 rounds per minute and 60,000 rounds per minute). The second material removal tool 108 can also be inserted into the wafer 102 by a relative motion between the second material removal tool 108 and the wafer 102. Apart from this, a relative motion between the second material removal tool 108 and the wafer 102 can be carried out along a direction perpendicular to the paper plane of FIG. 2 so as to form deepened and widened oblong longitudinally extending groove 104 along the direction indicated by reference numeral 114 in FIG. 4. The blade of the second material removal tool 108 for procedure two does not need to protrude through the wafer 102.

The second material removal tool 108 may move along direction 194 and along direction 195. The second material removal tool 108 is provided for increasing both a depth and a width of the groove 104 after the groove 104 shown in FIG. 1 has been formed by the first material removal tool 106. More specifically, the second material removal tool 108 deepens the preformed groove 104 from width d1 and depth L1 up to an increased width d2 of for instance 80 μm and up to an increased depth L2 of for instance 550 μm. Thus, the groove 104 formed according to FIG. 1 is further broadened and deepened according to FIG. 2 up to a second depth L2>L1 and up to a second width d2>d1. After carrying out the procedure described referring to FIG. 2, the groove 104 extends through the wafer 102 by about three quarters of the entire thickness of the wafer 102.

In the embodiment illustrated in FIG. 2, the second material removal tool 108 both widens and deepens the groove 104. In an alternative embodiment, it is however also possible that the second material removal tool 108 only widens the groove 104 without further deepening the groove 104.

The thicker second saw blade in form of the second material removal tool 108 advantageously avoids any negative impact on the advantageous burr characteristic when being carried out after the sawing procedure with the thinner first material removal tool 106 according to FIG. 1. Apart from this, the thicker second material removal tool 108 is also capable of removing rests (such as remaining portions of test structures, pads, etc.) of the layer arrangement 140 in the region of the saw line 142. The second material removal tool 108 may also remove residual burrs 146 and chipping from the first material removal tool 106.

FIG. 3 shows a third (and in the shown embodiment last) procedure carried out by apparatus 120 during singulating wafer 102 with the method described referring to FIG. 1 to FIG. 3.

For the purpose of executing this third sawing procedure, the apparatus 120 comprises a third material removal tool 110, which is embodied as a third saw blade and which is controlled as well by control unit 122. The third material removal tool 110 has a third thickness D3 of for instance 40 μm which is, in the shown embodiment, the same as the first thickness D1 but smaller than the second thickness D2. It is for instance possible that the third material removal tool 110 is the same tool which has been used before as the first material removal tool 106. This allows to provide the apparatus 120 in a compact way. However, alternatively, the third material removal tool 110 may be different from the first material removal tool 106 to specifically adapt its properties to the task of completing groove formation. Also the first material removal tool 106 may then be specifically adapted to its task of initiating groove formation.

The third material removal tool 110 is also configured for rotating around a rotation axis corresponding to a horizontal direction according to FIG. 3. For instance, a revolution speed of the third material removal tool 110 can be 55,000 rounds per minute (or more generally in a range between 30,000 rounds per minute and 60,000 rounds per minute). The third material removal tool 110 can also be inserted further deeper into the wafer 102 by a relative motion between the third material removal tool 110 and the wafer 102 until the groove 104 becomes a cut-out.

The third material removal tool 110 may move along direction 194 and along direction 195. Apart from this, a relative motion of the wafer 102 and the third material removal tool 110 can be executed by control unit 122 along a direction perpendicular to the paper plane of FIG. 3 so as to deepen the oblong longitudinally extending groove 104 along the direction indicated by reference numeral 114 in FIG. 4 until the groove 104 is converted into an oblong separation cut-out extending vertically through the entire wafer 102 and thereby separating the latter into separate portions. The third material removal tool 110 is thus provided for further increasing the depth of the groove 104 up to the entire thickness of the wafer 102 (and also slightly into the tape as carrier 118) after the groove 104 shown in FIG. 2 has been formed by the first material removal tool 106 and by the second material removal tool 108. More specifically, the third material removal tool 110 deepens the preformed groove 104 of width d2 and depth L2 until the bottom tip of the third material removal tool 110 extends through the lower main surface of the wafer 102 and thereby separates the wafer 102 into different parts. Descriptively speaking, the third material removal tool 110 converts the blind hole-type groove 104 according to FIG. 2 into a cut-out extending through the entire wafer 102 in a vertical direction. Hence, the described method subsequently further deepens the groove 104 of FIG. 2 until the wafer 102 is separated into separate electronic dies 100 or still larger sections of the wafer 102.

However, the sequence of procedures (in particular the three cutting procedures per saw line 142 in one direction and the three cutting procedures per saw line 142 in the perpendicular other direction) may be modified in other embodiments. For example, the wafer 102 can be sawn in strips or lines first and can then be separated, or the wafer 102 can be sawn completely to depth L2 and then be separated with the third cut.

As a result, the groove 104, which has now been converted into a cut-out or oblong through hole, has a third width d3 smaller than the second width d2 in a portion L3 of the wafer 102 below the second depth L2.

As a result of the described procedure of further increasing the depth of the groove 104 by the third material removal tool 110 until the bottom of the third material removal tool 110 extends through the bottom main surface of the wafer 102, the third material removal tool 110 may extend even into the tape-type carrier 118. Preferably, the control unit 122 controls the third material removal tool 110 to stop its downward motion before extending through the entire carrier 118 so as to extend into only a part of the, but not through the entire, thickness of the carrier 118.

In different embodiments, a continuous or a discontinuous (for instance stepwise) motion may be carried out vertically to the wafer surface. Sawing at a defined heights may correspond to a reverse motion on another height. In an embodiment, the respective material removal tool may be set to a desired height when it arrives at the wafer 102 and moves upwards to a defined height for reverse motion.

As a result of the controlled insertion of the third material removal tool 110 only partially into the carrier 118, the carrier 118 remains integrally connected and holds the separated and now individual electronic dies 100 adhesively. Stepping in horizontal direction of FIG. 4 and a rectangular turning of the wafer 102 may be accomplished for singularization.

For instance, the third material removal tool 110 may extend a certain spatial range x of for example 20 μm (or at least 20 μm) into the carrier 118 which may for instance have a thickness B of 85 μm. This ensures that the singularization of the wafer 102 is in fact completed and does not stop before the tip of the third saw blade has reached and separated the lower surface of the wafer 102.

Figure 6:
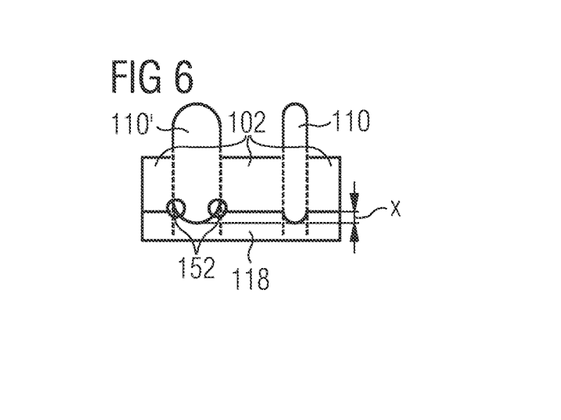
FIG. 6 illustrates the undesired phenomenon of formation of noses which may occur at a back side of the wafer when singularizing the wafer into separate electronic dies and which may be efficiently suppressed by exemplary embodiments.

The procedure according to FIG. 3 using again a narrower (as compared to the second material removal tool 108) saw blade as third material removal tool 110 has the advantage that an undesired formation of noses 152 at a bottom main surface of the wafer 102 can be strongly suppressed or even eliminated. Such noses 152 are artefacts generated as a result of the fact that the saw blade (in particular its annular exposure) may undergo a shape change from rectangular to rounded during sawing as a result of wear. This can be taken from FIG. 6 comparing a third material removal tool 110 according to an exemplary embodiment with an excessively thick material removal tool 110' resulting in undesired noses 152. The material removal tools 110, 110' or saw blades cut slightly into the dicing tape as carrier 118. In addition to the avoidance of silicon noses 152, back side chipping as well as cracking can be prevented according to an exemplary embodiment thanks to the described configuration of the third material removal tool 110. The thin blade of the third material removal tool 110 may prevent back side chipping.

Figure 4:
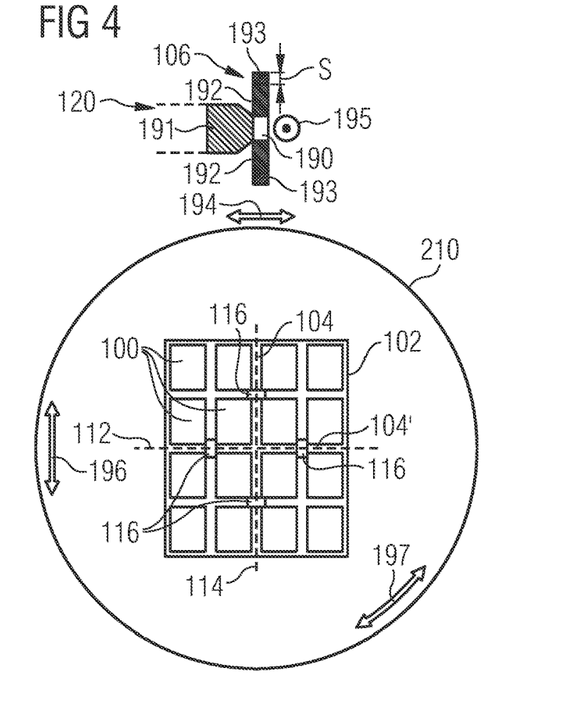
FIG. 4 illustrates a plan view of a wafer to be singularized, together with a part of a singularization apparatus, according to an exemplary embodiment.

FIG. 4 illustrates a plan view of a wafer 102 to be singularized into electronic dies 100 according to an exemplary embodiment. The wafer 102 is mounted on a chuck 210. FIG. 4 schematically illustrates only parts of the electronic dies 100 of the wafer 102, i.e. the central ones. Furthermore, FIG. 4 neither shows a tape as temporary carrier 118 on which the wafer 102 to be singularized may be attached, nor shows a circumferential frame for holding the carrier 118 together with the individual electronic dies 100 after singularization for simplifying handling. When the electronic dies 100 of the wafer 102 are arranged on the temporary carrier 118, which is, in turn, held by the mentioned frame, the arrangement of frame, carrier 118 and electronic dies 100 may be provided as bare-die-delivery. Alternatively, the individual electronic dies 100 may be mounted in cavities of a tape in a tape-and-reel configuration (not shown).

In order to separate the electronic dies 100 arranged in rows and columns on the wafer 102, cutting procedures of the type described above referring to FIG. 1 to FIG. 3 are to be carried out along both a horizontal direction as well as along a vertical direction according to FIG. 4. The procedure described above referring to FIG. 1 to FIG. 3 refers to the vertical cutting direction (see reference numeral 114) according to FIG. 4.

When completing cutting through the entire wafer 102 along direction or extension 114, a part of the procedure of cutting through the wafer 102 along further direction 112 being perpendicular with regard to direction or extension 114 may already be carried out. More specifically, deepening the groove 104 for transferring the latter into a cut-out using the third material removal tool 110 according to FIG. 3 along direction or extension 114 may be carried out only after having formed a further groove 104' extending perpendicular to the groove 104 and not yet extending completely through the entire wafer 102 along the horizontal direction 112. More specifically, the procedure according to FIG. 3 relating to groove 104 may be carried out after having carried out procedures according to FIG. 1 and FIG. 2 relating to groove 104', and before or after carrying out the procedure according to FIG. 3 relating to groove 104'. This ensures that the entire wafer compound is still integral when the first two procedures for forming groove 104' are carried out. This increases the stability of the wafer 102 during processing and provides accurate and reproducible separation results.

In another embodiment, it is possible to do only the first cut in both directions, and then in a next step do second and third cut. So the wafer keeps integral for the first cut and is cut through within the next step.

In another embodiment, cutting the wafer 102 into stripes or lines (by carrying out the first to third sawing procedure along the first direction) may be carried out first, followed by a corresponding procedure with the perpendicular stripes or lines along the second direction perpendicular to the first direction.

FIG. 4 also illustrates that the above-mentioned test structures 116 (such as a process control monitoring (PCM) test structures and/or a reliability control monitoring (RCM) test structures) may be located in the scribe lines or saw lines 142 (compare FIG. 2) and may be completely removed by the respective second material removal tool 108, both in the horizontal as well as in a vertical direction according to FIG. 4.

Concluding, the manufacturing architecture according to an exemplary embodiment and described referring to FIG. 1 to FIG. 4 has in particular the following advantages:

Back side chipping can be kept very small. The amount of material of the wafer 102 removed by the broader saw blade (i.e. the second material removal tool 108) can be kept small as well so that the mechanical load exerted on the broad saw blade can be kept small as well. The entire process is very flexible concerning the order of the execution of the different sub-procedures. Consequently, the process can be adjusted flexibly, i.e. so that the broad saw blade hits the still connected integral wafer 102 in both (in particular mutually perpendicular) saw channels which suppresses the risk of delamination. Moreover, a small tendency of front side chipping may be combined with a small risk of delamination.

Singularization of even very thick wafers 102 is possible with the described procedure even in the scenario of a high amount of PCM/RCM test structures 116 in the scribe line or dicing street. Also the generated dust or dirt (for instance silicon particles generated during sawing) can be kept small, since a high water reservoir is available for dirt removal, which also improves cooling. As a result of the reduced generation of dust or dirt during dicing, less silicon particles will be present in the scribe line or dicing street.

FIG. 4 is a schematic illustration showing a combination of a top side of wafer 102 and part of the dicing apparatus 120. The dicing blade itself is shown in FIG. 4 in a cross-sectional view from the top to make visible exposure 193, disc 192 and central hole 190. FIG. 4 illustrates a saw blade in form of first material removal tool 106. The general construction of the saw blade of the second material removal tool 108 and of the third material removal tool 110 may be as shown in FIG. 4. The illustrated saw blade is configured as a disk 192 (for instance made of nickel) with a central hole 190 configured for accommodating a shaft of a driving tool 191 of the apparatus 120. A ring 193 on an exterior circumferential surface of the disk 192 is also denoted as exposure.

Figure 7:
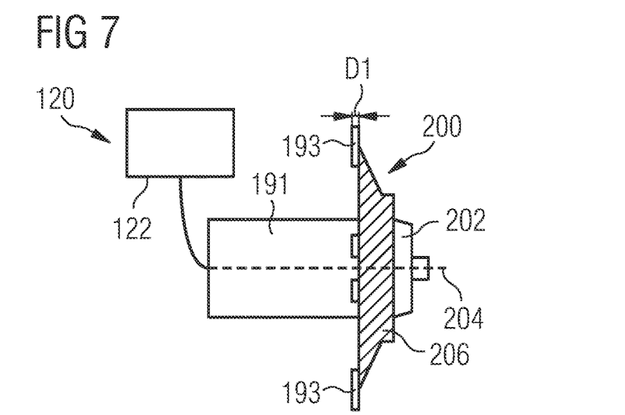
FIG. 7 illustrates a side view of a part of a singularization apparatus according to an exemplary embodiment comprising a hub blade.
Figure 8:
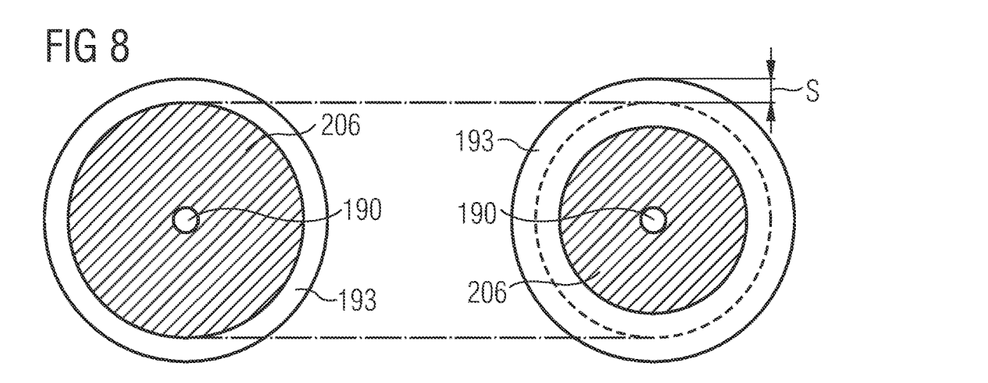
FIG. 8 illustrates a front view and a back view of the hub blade according to FIG. 7.
Figure 9:
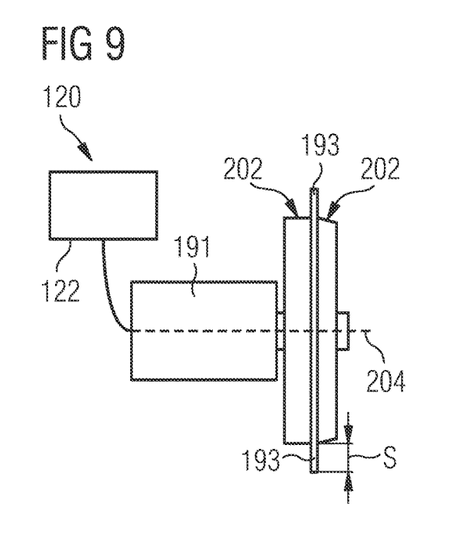
FIG. 9 illustrates a side view of a part of a singularization apparatus according to an exemplary embodiment comprising a hubless blade.
Figure 10:
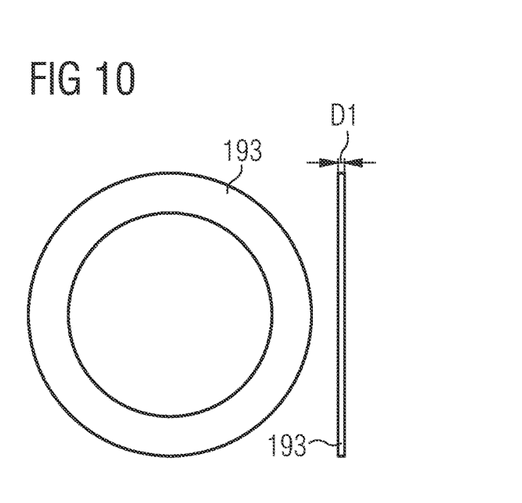
FIG. 10 illustrates a front view and a side view of the hubless blade according to FIG. 9.

A hub blade as shown in FIG. 7 and FIG. 8, or a hubless blade as shown in FIG. 9 and FIG. 10 may also be used in different embodiments.

The ring 193 may be composed of nickel and diamond particles. The diamond particles may have a diameter in the range between 2 µm and 8 µm and may significantly contribute to the actual sawing task. The radial extension S of the ring 193 may be for example 1 mm and should be larger than the cutting depth to be achieved according to FIG. 1 to FIG. 3, respectively, or even larger than the thickness of the wafer 102 to be separated. The ring 193 may have a substantially rectangular cross-section. However, an exterior surface of the ring 193 may be exerted to considerable load during sawing, so that the exterior surface can be rounded during operation of apparatus 120 due to wear.

As indicated by reference numeral 194, the first material removal tool 106 may be moved by a corresponding drive (not shown) of apparatus 120 along a direction which corresponds to the horizontal direction according to FIG. 4 (the mentioned motion may be linear and stepwise to dice all parallel lines 114, but for dicing one line 114 the wafer 102 may be moved along direction 196 continuously). Moreover, as indicated by reference numeral 195, the first material removal tool 106 may be moved along a direction which is perpendicular to the paper plane of FIG. 4 (in particular, the motion may be linear, but a defined height may be set). The motion along directions 194, 195 may be highly accurate.

As indicated by reference numeral 196, the wafer 102 (which may be mounted on a support body such as chuck 210) may be linearly moved by a corresponding drive (not shown) of apparatus 120 along a direction which corresponds to the vertical direction according to FIG. 4. Moreover, as indicated by reference numeral 197, the wafer 102 may be turned around an axis perpendicular to the paper plane of FIG. 4. The motion along direction 196 may be very rapid. Turning corresponding to reference numeral 197 shall be very accurate.

FIG. 7 illustrates a side view of a part of a singularization apparatus 120 according to an exemplary embodiment comprising a hub blade configuration. FIG. 8 illustrates a front view and a back view of the hub blade configuration according to FIG. 7.

In the shown hub blade configuration, the driving tool 191 relates to a spindle machine. A dicing blade 200 is configured radially symmetric with regard to a turning or rotation axis 204 and is connected to the driving tool 191 using a machine flange 202. The exposure ring 193, here having a thickness D1 and being the actual cutting tool, is mounted on the dicing blade 200. A hub is indicated with reference numeral 206.

FIG. 9 illustrates a side view of a part of a singularization apparatus 120 according to an exemplary embodiment comprising a hubless blade configuration. FIG. 10 illustrates a front view and a side view of the hubless blade configuration according to FIG. 9.

In the shown hubless blade configuration, the exposure ring 193 is clamped between two machines flanges 202.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing electronic dies by separating a wafer into the electronic dies, the method comprising:
    forming a groove in the wafer with a first material removal tool, the first material removal tool having a first thickness;
    enlarging the groove by a second material removal tool, the second material removal tool having a second thickness larger than the first thickness;
    subsequently increasing a depth of the groove by a third material removal tool, the third material removal tool having a third thickness smaller than the second thickness until the wafer is separated.

2. The method according to claim 1, the method comprising:
    forming a further groove', extending along a direction being angled with regard to an extension of said groove, in the wafer with the first material removal tool;
    enlarging the further groove' by the second material removal tool;
    subsequently increasing a depth of the further groove' by the third material removal tool until the wafer is separated at the further groove'.

3. The method according to claim 2, wherein the method comprises carrying out at least one of forming the further groove', enlarging the further groove', and separating the wafer at the further groove' after forming the groove and before separating the wafer at the groove.

4. The method according to claim 1, wherein the third thickness is larger than, smaller than or equal to the first thickness.

5. The method according to claim 1, wherein the method comprises completing removing of at least one test structure, in particular at least one of a process control monitoring test structure and a reliability control monitoring test structure, by the second material removal tool.

6. The method according to claim 1, wherein at least one of the first thickness and the third thickness is in a range between 20 µm and 60 µm.

7. The method according to claim 1, wherein the second thickness is in a range between 60 µm and 150 µm.

8. The method according to claim 1, wherein a ratio between the second thickness and one of the first thickness and the third thickness is in a range between 1.1 and 4.

9. The method according to claim 1, wherein a depth of the groove up to which the first material removal tool extends is in a range between 10% and 40% of an entire thickness of the wafer.

10. The method according to claim 1, wherein a depth of the groove up to which the second material removal tool extends is in a range between 60% and 90% of an entire thickness of the wafer.

11. The method according to claim 1, wherein the method comprises attaching a carrier to a main surface of the wafer before separation, wherein in particular, during further increasing the depth of the groove by the third material removal tool, the third material removal tool extends into the carrier.

12. The method according to claim 1, wherein at least one of the first material removal tool, the second material removal tool and the third material removal tool is a saw blade.

13. The method according to claim 1, wherein the wafer is non-encapsulated at the time of separating.

14. The method according to claim 1, wherein the method comprises also using the first material removal tool as the third material removal tool.

15. The method according to claim 1, wherein the method comprises using different tools as the first material removal tool and the third material removal tool.

16. The method according to claim 1, wherein the enlarging comprises widening the groove.

17. A method for singulating a workpiece into sections, the method comprising:
    forming a groove in the workpiece using a first saw blade, the first saw blade having a first thickness;
    widening the groove using a second saw blade, the second saw blade having a second thickness, wherein the second thickness is larger than the first thickness;
    further deepening the widened groove using a third saw blade, the third saw blade having a third thickness, wherein the third thickness is smaller than the second thickness.

18. The method according to claim 17, wherein the method comprises deepening the groove using the second saw blade.

19. The method according to claim 17, wherein the method comprises further deepening the widened groove in the workpiece using the third saw blade after having formed a further groove' intersecting the groove, extending perpendicular to the groove and not yet extending completely through the entire workpiece.

20. A method of separating a workpiece into separate sections, the method comprising:
    forming a groove in the workpiece up to a first depth and with a first width;
    subsequently widening the groove with a second width being larger than the first width;
    subsequently further deepening the groove until the workpiece is separated into the separate sections so that a resulting cut-out has a portion with a third width smaller than the second width;
    wherein subsequently widening the groove with the second width includes deepening the groove to a second depth.

21. A computer program product provided with computer executable code defining a procedure to be carried out by a control unit to cause an apparatus having first, second and third material removal tools for separating a wafer into electronic dies to perform the following steps:
   forming a groove in the wafer with the first material removal tool, the first material removal tool having a first thickness;
   enlarging the groove by the second material removal tool, the second material removal tool having a second thickness larger than the first thickness; and
subsequently increasing a depth of the groove by the third material removal tool, the third material removal tool having a third thickness smaller than the second thickness until the wafer is separated.

* * * * *